(12) United States Patent
Kan et al.

(10) Patent No.: US 8,542,540 B2
(45) Date of Patent: Sep. 24, 2013

(54) NONVOLATILE MEMORY AND METHODS FOR MANUFACTURING THE SAME WITH MOLECULE-ENGINEERED TUNNELING BARRIERS

(75) Inventors: Edwin C. Kan, Ithaca, NY (US); Tuo-Hung Hou, Chia-Yi (TW)

(73) Assignee: Cornell University, Ithaca, NY (US)

( * ) Notice: Subject to any disclaimer, the term of this patent is extended or adjusted under 35 U.S.C. 154(b) by 528 days.

(21) Appl. No.: 12/748,253

(22) Filed: Mar. 26, 2010

(65) Prior Publication Data
US 2010/0246269 A1    Sep. 30, 2010

Related U.S. Application Data

(60) Provisional application No. 61/163,883, filed on Mar. 27, 2009.

(51) Int. Cl.
*G11C 11/34* (2006.01)
(52) U.S. Cl.
USPC ............ 365/185.28; 365/185.01; 365/185.33; 365/174; 365/180; 977/734; 977/742; 977/749; 977/750; 977/755

(58) Field of Classification Search
USPC .................. 365/185.28, 185.01, 185.33, 174, 365/180; 977/734, 742, 749, 750, 755
See application file for complete search history.

(56) References Cited

U.S. PATENT DOCUMENTS

| | | | |
|---|---|---|---|
| 5,999,444 A * | 12/1999 | Fujiwara et al. ......... 365/185.02 |
| 6,646,302 B2 | 11/2003 | Kan et al. |
| 6,680,505 B2 | 1/2004 | Ohba et al. |
| 6,743,709 B2 | 6/2004 | Kan et al. |
| 7,259,984 B2 | 8/2007 | Kan et al. |
| 7,504,280 B2 | 3/2009 | Khang et al. |
| 7,629,642 B2 | 12/2009 | Ohba |
| 2008/0096306 A1 * | 4/2008 | Kolake et al. ............... 438/99 |
| 2009/0212349 A1 | 8/2009 | Kai et al. |
| 2011/0033996 A1 * | 2/2011 | Deleonibus et al. ......... 438/287 |

FOREIGN PATENT DOCUMENTS

| JP | 2002289710 A | 10/2002 |
|---|---|---|
| JP | 2003078050 A | 3/2003 |

OTHER PUBLICATIONS

Hou et al, Appl. Phys. Lett. 92, 153109 (2008); Nonvolatile memory with molecule-engineered tunneling barriers. Apr. 2008.*
Hou, Tuo-Hung et al., "Nonvolatile memory with molecule-engineered tunneling barriers", Mar. 28, 2008 "Hou Pre-Print," arxiv.org/abs/0803.4038 (12 pages).

* cited by examiner

*Primary Examiner* — Vu Le
*Assistant Examiner* — Han Yang
(74) *Attorney, Agent, or Firm* — Harris Beach PLLC

(57) ABSTRACT

Embodiments of tunneling barriers and methods for same can embed modules exhibiting a monodispersion characteristic into a dielectric layer (e.g., between first and second layers forming a dielectric layer). In one embodiment, by embedding $C_{60}$ molecules inbetween first and second insulating layers forming a dielectric layer, a field sensitive tunneling barrier can be implemented. In one embodiment, the tunneling barrier can be between a floating gate and a channel in a semiconductor structure. In one embodiment, a tunneling film can be used in nonvolatile memory applications where $C_{60}$ provides accessible energy levels to prompt resonant tunneling through the dielectric layer upon voltage application.

17 Claims, 6 Drawing Sheets

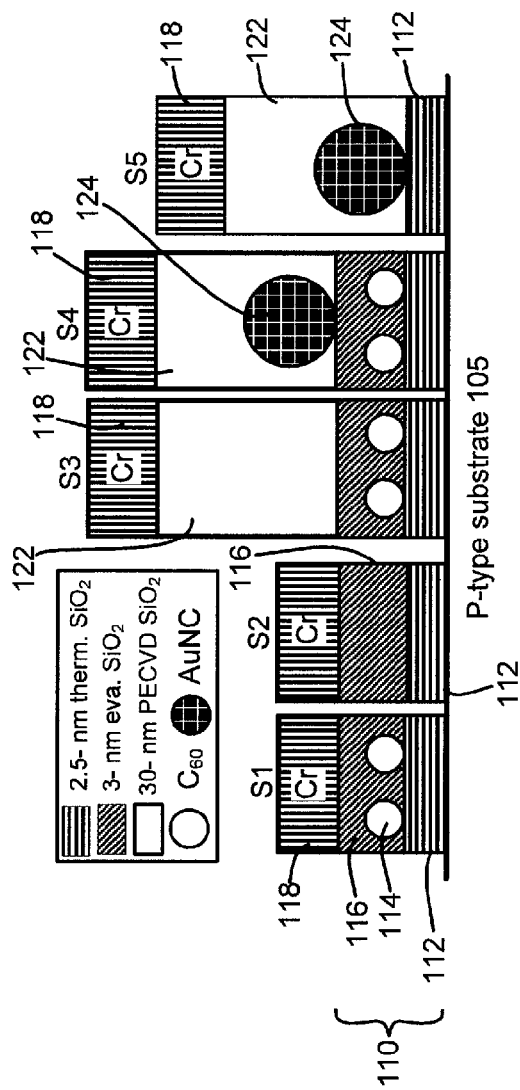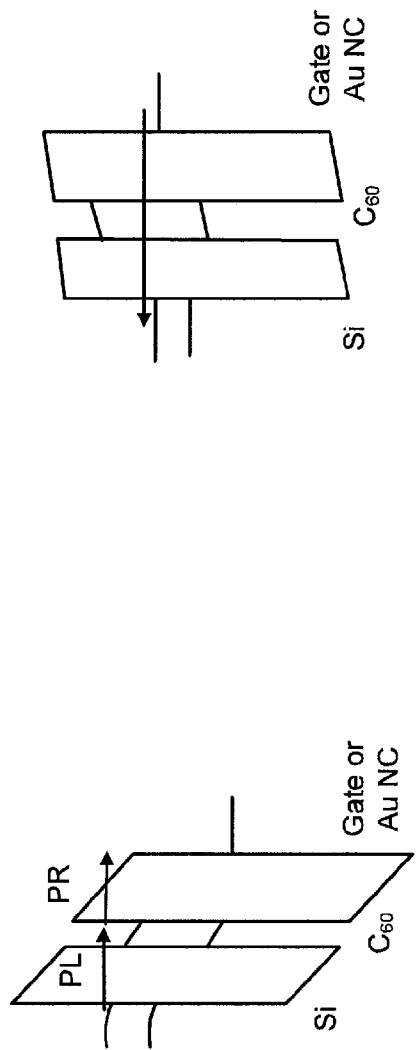
FIG. 1A
FIG. 1B
FIG. 1C

NONVOLATILE MEMORY AND METHODS FOR MANUFACTURING THE SAME WITH MOLECULE-ENGINEERED TUNNELING BARRIERS

CROSS REFERENCE TO RELATED APPLICATIONS

This application claims the priority of U.S. Provisional Application No. 61/163,883, filed Mar. 27, 2009 entitled "Resonant Tunneling Barrier Using $C_{60}$ For Tunnel Oxide In Flash Memory," which is incorporated herein by reference in its entirety.

STATEMENT REGARDING FEDERALLY SPONSORED RESEARCH OR DEVELOPMENT

This invention was made with Government support under Grant Number EEC-0646547 awarded by the National Science Foundation. The United States Government has certain rights in the invention.

FIELD OF THE INVENTION

The present invention relates to tunneling barriers and/or semiconductor structures including tunneling barriers and methods for manufacturing the same.

DESCRIPTION OF THE RELATED ART

In the related art, charge-based nonvolatile flash memory technology, the ratio between retention time $t_R$ and program/erase (P/E) time $t_{PE}$ is about $10^{12}$-$10^{14}$. To realize this tremendous ratio, field asymmetric tunneling processes in the tunneling barrier have to be deliberately engineering between data retention and data P/E. The asymmetry in the related art flash memory cells can be provided by external P/E voltages.

For example, in NAND flash memory, the asymmetry between the Fowler-Nordheim tunneling under data P/E and the direct tunneling during data retention is exploited. However, this related art approach limits the scalability of the P/E voltage, which is quickly becoming the major scaling roadblock, considering power dissipation, cycling endurance, and peripheral circuitry design.

SUMMARY OF THE INVENTION

Embodiments of systems and/or methods according to the application relate to a novel tunneling barrier. In one embodiment, a tunneling barrier can include embedded monodispersive molecules in a tunnel insulating layer. In one embodiment, $C_{60}$ molecules are embedded in a tunnel insulating layer (e.g., $SiO_2$) for nonvolatile memory applications. According to exemplary embodiments, $C_{60}$ molecules are selected because of its monodispersion characteristic. $C_{60}$ molecules in the tunneling barrier provide accessible energy levels in semiconductor devices for resonant tunneling processes. In addition, $C_{60}$ molecules in the tunneling barrier are compatible with conventional semiconductor manufacturing processes (e.g., high temperatures, impinging high energy plasma, annealing processes, etc.). Further, $C_{60}$ molecules provide selectable accessible energy levels to prompt resonant tunneling through insulating $SiO_2$ at high fields, however, this process is quenched at low fields due to HOMO-LUMO gap and large charging energy of $C_{60}$. Furthermore, embodiments of system and/or methods according to the application provide charge-based nonvolatile flash memory technology and/or a field sensitive tunneling barrier that can result in an improvement of more than an order of magnitude in retention time to program/erase time ratios for a nonvolatile memory.

According to an aspect of the application, embodiments of nonvolatile memory devices include tunneling barriers that can include embedded monodispersive molecules in a tunnel insulating layer.

According to one aspect of the application, monodispersive molecules in tunneling barriers can include fullerenes such as $C_{60}$ molecules.

According to one aspect of the application, $C_{60}$ molecules can be provided with variable prescribed energy level characteristics by chemical functionalization.

According to an aspect of the application, embodiments of nonvolatile memory devices include $C_{60}$ molecules are embedded in a $SiO_2$ tunnel insulating layer to provide a tunneling barrier.

According to an aspect of the application, semiconductor devices can include a semiconductor substrate, and a nonvolatile memory cell provided on the semiconductor substrate. The nonvolatile memory cell can include a tunnel insulating film including monodispersive molecules provided on a surface of the semiconductor substrate. A charge storage layer is provided on the tunnel insulating film, an insulating film is provided on the charge storage layer, and a control electrode is provided on the insulating film.

According to an aspect of the application, semiconductor devices can exhibit increased retention time/program-erase time ratios.

According to an aspect of the application, semiconductor devices with field asymmetric tunneling processes in a tunneling barrier can be provided.

According to an aspect of the application, semiconductor devices tunnel dielectrics with prescribed characteristics can be provided by integrating molecules in hybrid molecular-silicon electronics.

In one embodiment, a semiconductor device can include a semiconductor substrate; and a nonvolatile memory cell provided on the semiconductor substrate, the nonvolatile memory cell comprising a tunnel insulating film provided over a surface of the semiconductor substrate, the tunnel insulating film comprising a layer of monodispersed molecules; a charge storage layer provided on the tunnel insulating film; an insulating film provided on the charge storage layer; and a conductive layer provided on the insulating film.

In one embodiment, a nonvolatile flash memory card can include a random access memory array; an input/output unit to operatively connect the random access memory to receive or transmit data; and a microcontroller to control data storage or data retrieval between the input/output unit and the random access memory array, wherein at least one cell of the random access memory array comprises, a semiconductor region having a source region, a drain region, and a channel region provided between the source region and the drain region, a first tunnel insulation film formed on the channel region, a barrier layer formed on the first tunnel insulation film, the barrier layer comprising a layer of monodispersed molecules, the barrier layer including a prescribed energy barrier level, a second tunnel insulation film formed on the barrier layer, a charge storage portion formed over the second tunnel insulation film, and a control electrode on the charge storage portion.

In one embodiment, a method of forming a tunnel barrier for a semiconductor device can include providing an active region at a semiconductor substrate; and providing a tunnel insulating film over the active region, wherein providing the tunnel insulating film comprises, forming a first tunnel insulation layer formed over the active region, forming a layer of conductive monodispersed fullerene molecules over the first tunnel insulation layer, and forming a second tunnel insulation layer formed over the monodispersed fullerene molecules, wherein the tunnel insulating film comprises the tunnel barrier.

BRIEF DESCRIPTION OF THE DRAWINGS

The features described herein can be better understood with reference to the drawings described below. The drawings are not necessarily to scale, emphasis instead generally being placed upon illustrating the principles of the invention. In the drawings, like numerals are used to indicate like parts throughout the various views.

FIG. 1a is a diagram showing schematics of various exemplary heterogeneous semiconductor structures, selective ones of which include exemplary embodiments of tunneling barriers according to the application;

FIGS. 1b-1c are diagrams showing respective energy band level diagram representations of tunneling barriers resonant tunneling through $C_{60}$ under high electric field and tunnel barriers direct tunneling through $C_{60}$ under low electric field according to exemplary embodiments of tunneling barriers (e.g., S1, S3, S4) of the application;

DETAILED DESCRIPTION OF EXEMPLARY EMBODIMENTS

Figure 2:
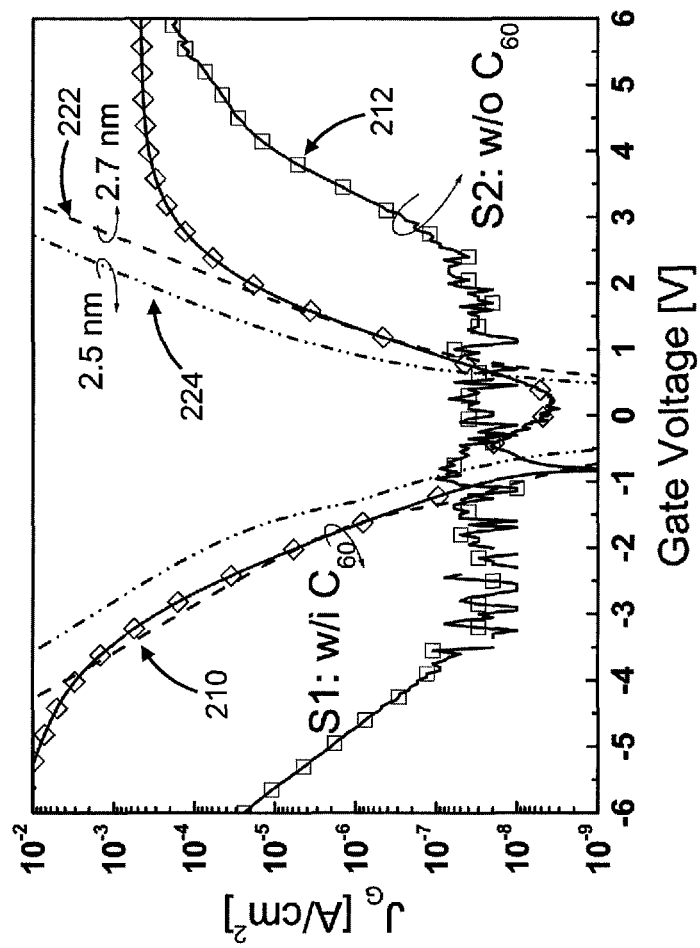
FIG. 2 is a diagram that shows exemplary gate current characteristics for a tunneling barrier embodiment according to the application and a control structure.

An exemplary process for fabricating exemplary embodiments of tunneling barriers, semiconductor structures, and semiconductor devices using the same will now be described. However, embodiments of the application is not intended to be so limited as additional processes may be utilized based on the resulting tunnel barriers achieving the functionality described herein.

FIG. 1 is a diagram showing schematics of various exemplary heterogeneous semiconductor structure stacks (S1-S5), selective ones of which include exemplary embodiments of tunneling barriers according to the application. As shown in FIG. 1a, metal oxide semiconductor (MOS) capacitors with conventional local oxidation of Si (LOCOS) isolation on p-type semiconductor substrates were fabricated in one embodiment. After 2.5 nm dry thermal oxidation, $C_{60}$ molecules were thermally evaporated to a thickness of 0.4 to 0.6 nm as measured by the quartz crystal monitor, followed by $SiO_2$ evaporation of 3 nm to complete the tunneling barrier formation. The $C_{60}$ molecules were obtained commercially (i.e., MER Corporation 99.9%). The area density of $C_{60}$ molecules can be determined by electrical measurement. The area density of $C_{60}$ molecules estimated from the electrical measurement is around $2\times10^{12}/cm^2$.

As shown in FIG. 1a, for the metal NC memory cell structure S4, after the tunneling oxide formation on p-type semiconductor substrates, spherical Au nanocrystals (NCs) were self-assembled on the oxide by the electron beam evaporation of 1.2 nm Au without annealing. $SiO_2$ control oxide was deposited by plasma enhanced chemical vapor deposition (PECVD) to a thickness of 30 nm. Finally, a top Cr gate was patterned, followed by 400° C. forming gas annealing for 30 minutes.

Exemplary experimental results provided by the heterogonous semiconductor structure stacks S1-S5 (e.g., gate stacks S1-S5) are described herein and illustrated in FIG. 1a. As shown in FIG. 1a, the stack S1 includes an embodiment of a tunneling oxide formation 110 including a first insulating layer 112 and a second insulating layer 116 including a conductive monodispersive molecule layer 114 of $C_{60}$ molecules therebetween formed on substrate 105 (e.g., p-type substrate). The substrate 105 can include source regions and drain regions (not shown) adjacent the stacks S1-S5. A conductive layer 118 of metal (e.g., Cr) over the tunneling oxide formation 110 can be formed as a gate electrode for the stack S1. The stack S2 includes the first insulating layer 112, the second insulating layer 116, and the conductive layer 118 formed on the substrate 105.

As shown in FIG. 1a, the stack S3 includes the tunneling oxide formation 110 on the substrate 105 (e.g., p-type substrate). A third insulating layer 122 of $SiO_2$ is formed over the tunneling oxide formation 110 and below the conductive layer 118. The stack S4 includes a charge storage layer 124 of spherical Au NC between the tunneling oxide formation 110 and the third insulating layer 122. The charge storage layer 124 and third insulating layer 122 can function as a floating gate and floating insulating layer, respectively. Further, the stack S5 includes the first insulating layer 112, the charge storage layer 124, the third insulating layer 122, and the conductive layer 118 formed on the substrate 105.

FIG. 2 is a diagram that shows increased gate current using an embodiment of tunneling barriers according to the application. The control sample or the stack S2 without the $C_{60}$ layer is shown for comparison. As shown in FIG. 2, gate current 210 through the stack S1 is increased relative to the gate current 212 through the stack S2. The gate current 210 through the stack S1 uses an exemplary $C_{60}$ embedded layer 114. Again, the stack S1 consists of tunneling oxide (e.g., 2.5 nm thermal $SiO_2$+$C_{60}$+3 nm evaporated $SiO_2$) but not top layers of Au NC and PECVD $SiO_2$. As shown in FIG. 2, the stack S1 shows exponential gate current 210 increase by four orders of magnitude caused by resonant tunneling through the molecular levels of $C_{60}$ of the tunneling oxide formation 110. The $C_{60}$ molecules in layer 114 are closer to the channel and can have a larger and more controllable density than evaporated $SiO_2$ traps.

As shown in FIG. 2, the gate current saturation above ±3V is limited by high substrate resistance and insufficient minority carrier generation under inversion. Since these field conditions are very far away from those in normal memory operations, the results shown in FIG. 2 are satisfactory to demonstrate the resonant tunneling effect of the layer 114. In addition, theoretical tunneling current calculation by the Wentzel-Kramer-Brillouin (WKB) approximation (222, 224)

is shown in FIG. 2 to compare with the experimental data from the stack S1 and the stack S2. The gate current 210 from the stack S1 agrees well with a gate current 222 from an ideal theoretical 2.7 nm $SiO_2$ barrier. The gate current 210 from stack S1 is only ten times smaller than the calculated WKB theoretical gate current 224 for a single layer of 2.5 nm $SiO_2$ despite much thicker physical thickness provided by the top $C_{60}$ and evaporated $SiO_2$ layers (e.g., layers 114, 116).

FIGS. 1b-1c are diagrams that show energy band level diagram representation of tunneling barriers resonant tunneling using $C_{60}$ (e.g., under electric fields) and tunnel barriers direct tunneling using $C_{60}$ (e.g., under low electric fields for layer 114). An exemplary energy band level diagram of the $C_{60}$ embedded barrier under high bias conditions, such as program operations, is illustrated in FIG. 1b. The HOMO-LUMO gap (highest occupied molecular orbital, lowest unoccupied molecular orbital) of $C_{60}$ is about 1.64 eV with HOMO and LUMO levels being five fold and three fold degenerate, respectively. Further, the specific energy level alignment with the bands of the surrounding dielectrics is determined by interface dipole formation and redox states of $C_{60}$ at thermal equilibrium. Under sufficient external bias, resonant tunneling through $C_{60}$ energy levels is enabled because the energy of injected electrons from the Si channel exceeding the $C_{60}$ energy levels and Coulomb charging energy. A two step tunneling process can describe the observed experimental results to the first order. The two step tunneling current density J in the weak coupling regime with accessible energy levels provided by the intermediate $C_{60}$ molecules can be expressed as equation (1) below:

$$J = \sum_{E=E_a}^{\infty} qC(E)N_t\sigma_t \frac{P_L(E)P_R(E)}{P_L(E)+P_R(E)} \quad \text{Eq. (1)}$$

where $N_t$ is the density of $C_{60}$ $\sigma_t$ is the effective capture cross section of $C_{60}$, $P_L$ and $P_R$ are the tunneling probabilities through the left and right oxide barriers, C is the electron source function of the channel. The summation in equation (1) takes into account all electrons with energy higher than the first accessible energy level of $C_{60}$ molecules $E_a$. Here it can be assumed that the occupancy factors are 1 and 0 for the conduction band electron states in the channel and gate, respectively. In FIG. 2, the similarity of J-V shapes between the 2.5 nm $SiO_2$ and the $C_{60}$ embedded barrier implies J is mainly controlled by the left barrier, e.g., PL<<PR. This is because bulk traps in the evaporated $SiO_2$ can enhance $P_R$ (e.g., significantly or greatly) through the trap assisted tunneling process. Very high $C_{60}$ density with a reasonable $\sigma_t$=5× $10^{-14}$ $cm^2$ can account for the ten times current reduction in the results in comparison with the single layer of 2.5 nm $SiO_2$. On the contrary, under low bias conditions, the resonant tunneling is largely reduced or forbidden due to both the $C_{60}$ HOMO-LUMO gap and the Coulomb charging energy as shown in FIG. 1c. The direct tunneling current can be extremely low for a thick barrier and was evaluated through the retention measurement in the memory cell described below. In an actual implementation, the trap assisted tunneling through the interface states between $C_{60}$ and $SiO_2$ and the bulk traps in evaporated $SiO_2$ can lead to higher current. Further, design optimization for an increased or a maximum tunneling asymmetry may be possible by engineering the HOMO-LUMO gap and charging energy of different molecules as well as the dielectric thickness.

Figure 3:
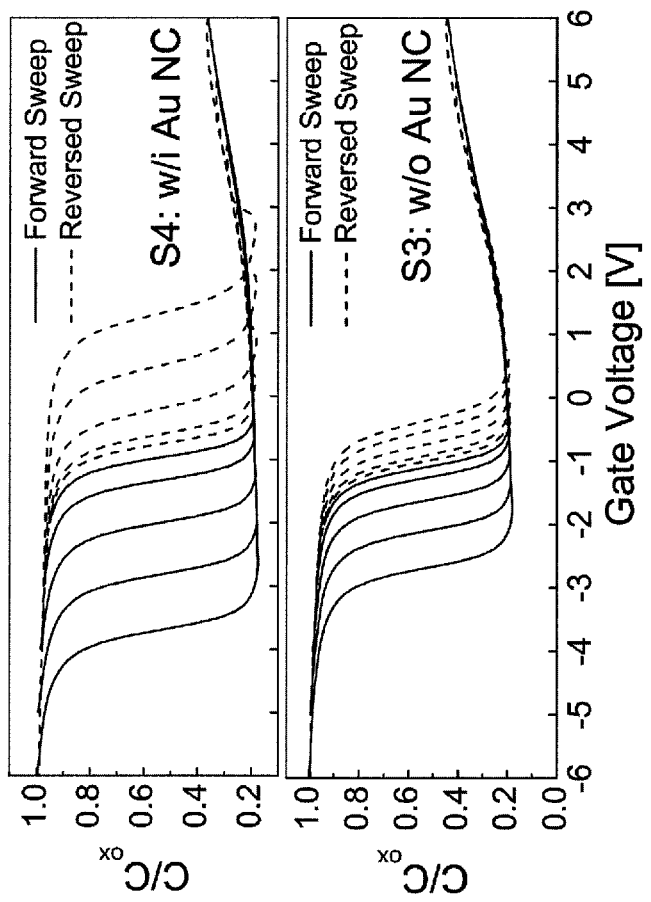
FIG. 3 is a diagram that shows high frequency CV sweeps for semiconductor structure stacks (e.g., memory cells) without the Au NC layer and with the Au NC layer, respectively, and including an exemplary $C_{60}$ embedded tunneling barrier embodiment.

FIG. 3 is a diagram that shows high frequency CV sweeps for semiconductor structure stacks, (e.g., memory cells) without the Au NC layer and with the Au NC layer. Both S3 and S4 include an exemplary $C_{60}$ embedded tunneling barrier embodiment. The high frequency capacitance voltage (CV) sweeps with increasing range from ±2 V to ±6 V are shown in FIG. 3 for the stack S3 without the AU NC layer S3 and for the stack S4 with the Au NC layer. Both the stacks S3 and S4 include the $C_{60}$ embedded tunneling barrier 110. In a separate control sample without both $C_{60}$ and Au NC but with all other dielectric layers, no hysteresis is observed under the same sweep range. In the stack S3, larger negative flat band shifts ($\Delta V_{FB}$) demonstrate the preferable hole storage at monoanion $C_{60}^{1-}$ and the higher charge neutrality level (CNL) of interface states between $C_{60}$ and $SiO_2$. In the stack S4, much larger and symmetric flat band shifts ($\Delta V_{FB}$) clearly demonstrate that both electron and hole can indeed be injected into the upper Au NCs through the resonant tunneling modes provided by $C_{60}$. Thus, the stack S3 and the stack S4 demonstrate with selected tunneling injection structure the memory window (e.g., charge stored, voltage shift) can be enhanced.

Figure 4:
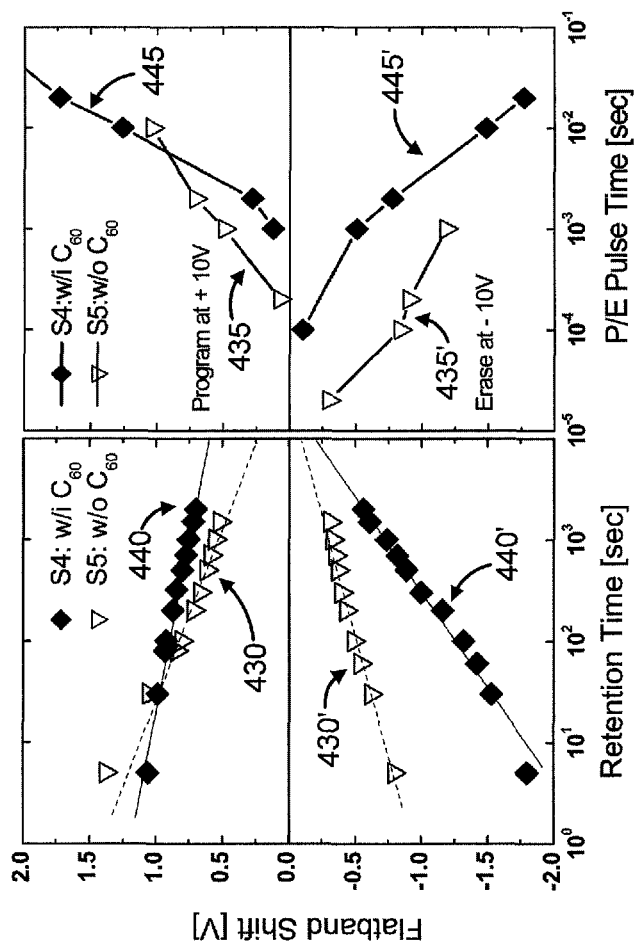
FIG. 4 is a diagram that shows retention and P/E characteristics of an exemplary embodiment of metal NC memories, (e.g., S4) with a composite barrier of 2.5 nm thermal $SiO_2$+ $C_{60}$+3 nm evaporated $SiO_2$. For consistent initial conditions, the preset bias prior to the retention and P/E measurements can be ±5V for 3 sec.

FIG. 4 is a diagram that shows exemplary retention time characteristics and program/erase time characteristics for semiconductor structures using embodiments of tunneling barriers according to the application. As shown in FIG. 4, the retention and P/E characteristics of a metal NC memory cell with a single layer of 2.5 nm $SiO_2$ in the stack S5 are compared with the stack S4 including the tunnel barrier 110. The stack S4 has longer retention 440, 440' due to the lower escape rate of thermally excited electrons and holes in Au NCs through a physically thicker barrier provided by the additional $C_{60}$ and top $SiO_2$ layers than the retention time 430, 430' of the stack S5. This is more pronounced for electron storage with at least two orders of magnitude improvement in the extrapolated retention time. The improvement in rejection time is likely due to the suppression of trap assisted tunneling of electrons with the high CNL at the $C_{60}$/$SiO_2$ interface. The P/E speed 445, 445' at ±10 V in the stack S4 is only about ten times slower than the P/E speed 435, 435' at ±10 V for the stack S5, which is in close agreement with the tunneling current results shown in FIG. 2. Even though the P/E voltage results has not yet been optimized, which is expected to scale by improving the coupling ratio with either a thinner or a higher-$_K$ control oxide, improved $t_R/t_{PE}$ ratio by at least an order is shown with the field sensitive $C_{60}$ embedded tunneling barrier in FIG. 4. Further, improvement in the results can be achieved by reducing the non-ideal effects by the $C_{60}$/$SiO_2$ interface states and/or the bulk traps in the evaporated $SiO_2$.

Figure 5:
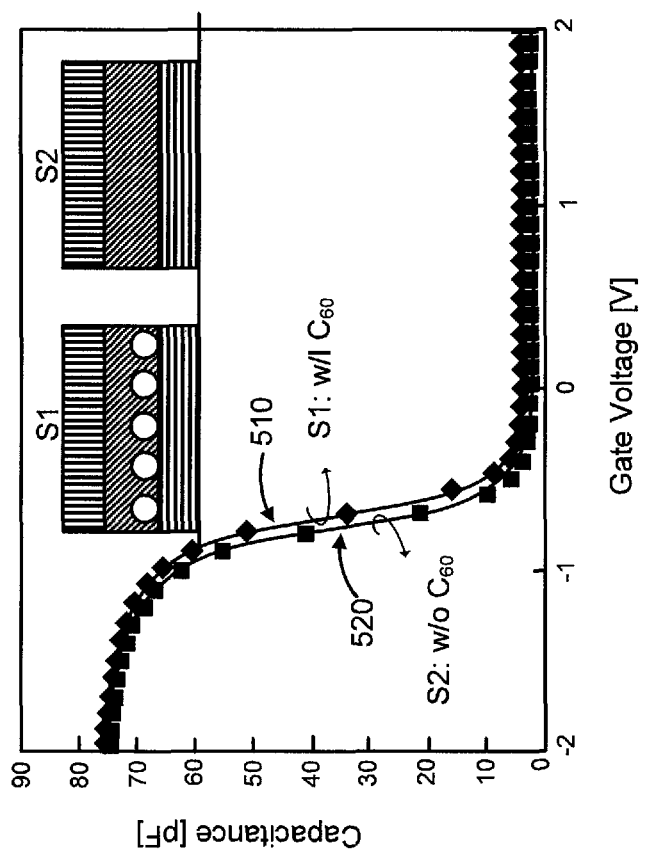
FIG. 5 is a diagram that shows exemplary C-V characteristics of exemplary semiconductor structures, one of which includes an embodiment of a tunneling barrier according to the application.

FIG. 5 is a diagram that shows exemplary C-V characteristics of exemplary semiconductor structures according to the application. As shown in FIG. 5, a C-V sweep 510 for the stack S1 and a C-V sweep 520 for the stack S2 show that the structures do not retain charge (e.g., a negligible memory window). Thus, embodiments of a tunnel barrier 110 do not operate to store a charge.

Embodiments according to the application provide implementations of tunnel barriers by utilizing the monodispersion characteristic of exemplary nanoscale entities. Embodiments provide the first or novel demonstration of molecule engineered tunneling barriers in semiconductor (e.g., Si) devices. Exemplary nanoscale entities include monodispersive molecules such as but not limited to fullerene molecules or $C_{60}$ molecules. In addition, embodiments of tunneling barriers or semiconductor structures including the same can provide consistent and/or accurate control of $C_{60}$ molecule size or monodispersive molecule size throughout (e.g., even at a wafer level). Embodiments according to the application can provide $C_{60}$ molecules with variable prescribed energy level characteristics by chemical functionalization. In one embodiment, metal molecules (e.g., $C_0$, W, Zr) can be embedded in the $C_{60}$ molecules to modify energy level(s). Embodiments according to the application provide implementations of a double tunnel junction by utilizing a monodispersion implementation of exemplary nanoscale entities. Further, embodiments provide an increased or improved $t_R/t_{PE}$ ratio in a memory integrated with inventive tunneling barrier. In one embodiment, $C_{60}$ molecules in the tunneling barrier provide accessible energy levels in semiconductor devices for resonant tunneling processes. In addition, $C_{60}$ molecules in the tunneling barrier are compatible with conventional semiconductor manufacturing processes (e.g., high temperatures, high energy plasma impinging, annealing processes, etc.).

In one embodiment, exemplary tunneling barriers include a first insulating layer, a layer of monodispersive conductive molecules and a second insulating layer. The first insulating layer and the second insulating layer can be, for example, 0.5 nm, 1 nm, 2 nm, 3 nm or more than 5 nm thick. In one embodiment, the monodispersive conductive molecules layer can be less than 0.5 nm thick, 1 nm thick, 1.2 nm thick, 3 nm thick, 5 nm thick, 10 nm thick and can comprise $C_{60}$ molecules. Exemplary semiconductor structures can include such tunneling barriers. Exemplary memory cells or circuits can add stacked charge storage layers, a third insulating layer, a conductive layer or electrode over the tunneling barriers, and source and drain electrodes.

Figure 6:
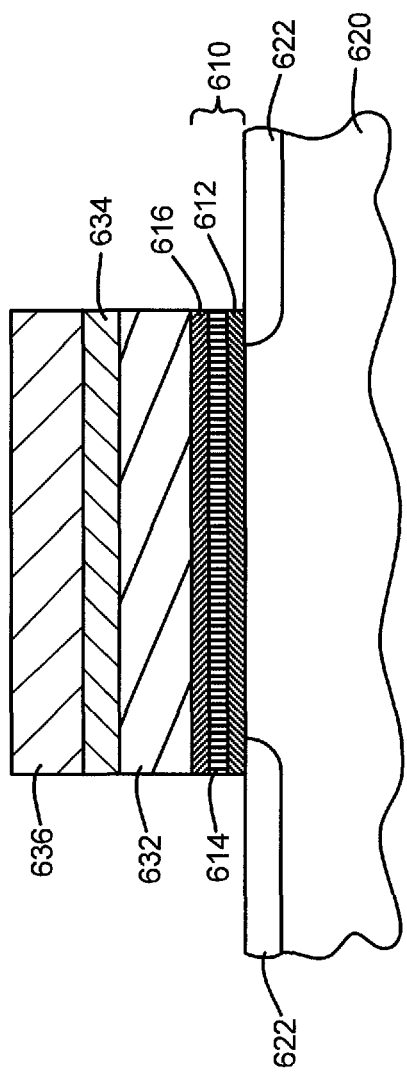
FIG. 6 is a diagram that shows a cross-sectional view of an exemplary embodiment of a nonvolatile semiconductor memory device according to the application.

FIG. 6 is a diagram that shows a cross-sectional view of an exemplary embodiment of a nonvolatile semiconductor memory device according to the application. First of all, as shown in FIG. 6, tunnel insulating film 610 can include a first tunnel insulating film (e.g., silicon oxide film) 612, a layer of conductive molecules 614 exhibiting a monodispersion characteristic, and a second tunnel insulating film (e.g., silicon oxide film) 616. The first tunnel insulating film 612 can be formed on or over a semiconductor substrate (e.g., silicon substrate) 620. The layer of conductive molecules 614 exhibiting a monodispersion characteristic can be fullerene molecules such as, but not limited to, a $C_{60}$ layer of molecules.

A charge storage portion (e.g., floating gate) 632 can be over the tunnel insulating film 610. In one embodiment, the charge storage portion can include metal NC particles. Alternatively, the charge storage portion can include a conductive layer, a polysilicon, silicon-rich silicon nitride film (e.g., formed by known processes using selected source gas ratios or the like). A control insulation film 634 and control gate electrode 636 can be over the charge storage portion 632.

A mask (e.g., resist pattern), for example, can be used to pattern a control gate electrode layer, a control insulation layer, a charge storage layer, a tunnel insulation film (e.g., dielectric, $C_{60}$ molecules, dielectric) to form the stacked structure shown in FIG. 6. Thereafter, impurities (e.g., n-type) can be ion-implanted into the substrate 620 (e.g., p-type) and an optional annealing process can highly doped impurity diffusion layer 622, which can serve as the source region (e.g., first electrode) and the drain region (second electrode).

In this way, a floating gate type memory device can be obtained as shown in FIG. 6. In the floating gate type memory device, it is possible to bring in and out the information charge to and from the charge storage portion (e.g., traps of a floating gate) 632 via embodiments of the tunnel insulation film including the monodispersive molecule layer, which can form a double tunnel junction under the control of the control gate electrode 636.

Operations to write, read, and erase information for the floating gate type memory device as shown in FIG. 6 will now be described. Briefly summarized, information can be written by injecting electrons into the charge storage portion 632 (e.g., floating gate). For example, by applying the positive voltage to the control gate electrode 636, carrier electrons in the inversion layer formed in the silicon substrate 620 surface can be injected into the charge storage portion 632 (e.g., traps) via the tunnel barrier 610. Information can be read by discriminating quantity of drain current that complies with presence or absence of stored charges. Stored charges can be discharged by allowing the stored charges to tunnel to the silicon substrate 620 via the tunnel barrier 610 (e.g., with the C60 layer interdispersed therein) by applying negative voltage to the control gate electrode 636. Since information write, read, and erase operations are similar as those in the related art, a detailed description is omitted here.

By taking advantages of versatile and tunable molecular properties according to embodiments of the application, integration of molecules in Si-based devices can provide a way to tailor tunneling dielectric properties. Although metal NC memory were disclosed herein, tunneling barrier embodiments according the application can be applied for other charge based memories such as, but not limited to conventional NAND Flash, Si NC, SONOS memories, and MONOS memories.

In addition, in exemplary embodiments, the semiconductor structures, tunneling barrier, and floating gate memories based on N-type structures are described, but embodiments according to the application can be applied to P-type structures.

Related art metal nanocrystal (NC) memory has been proposed to enhance the tunneling asymmetry. For example, a double tunnel junction structure consisted of a layer of about 1-nm Si NCs sandwiched between two $SiO_2$ layers where the Si NCs were crystallized by annealing a $SiO_2$/a-Si/$SiO_2$ structure. The size of NCs plays a role in the double tunnel junction performance. However, size variation of the Si NC cannot be controlled and can cause reproducibility issues such as device variation within a memory array.

Further, in exemplary embodiments, tunnel barriers can be considered a double tunnel junction provided between two tunnel insulation films. However, the multiple tunnel junction may be adopted in which a layer of monodispersive molecules and the tunnel insulation film are alternately stacked and charge and discharge may be carried out via a multiple tunnel junction.

According to exemplary embodiments described herein, memory devices implementing 1 bit per cell can be provided. However, embodiments are not intended to be so limited as multi-bit memory devices or cells can be provided using embodiments of tunneling barriers.

The tunnel insulating layers can be formed by various conventional processes including, for example, thermal oxidation process, CVD processes, LPCVD processes, PECVD processes, or the like. The tunnel insulating layers can use conventional materials for flash memory technology such as silicon oxide or dielectrics (e.g., hafnia, alumina, or combinations thereof). Further, in exemplary embodiments, conventional materials for flash memory technology such as metal NC, metal layers, Si-rich silicon nitride film, silicon oxide film, can be used for the floating gate (charge storage portion).

Embodiments according to the application can include memory cell arrays, which can constitute a NAND flash memory or the like. For example, embodiments of systems and/or methods according to the application can be used for semiconductor devices adapted for use in electronic equipment, such as but no limited to SSD, notebook computers, portable computer, PDAs, telephones, cameras, music playback devices, which can be equipped with memory. Embodiments according to the application can be a memory cell including a tunnel insulating film, a floating gate electrode, a control gate electrode, an interelectrode insulating film, and source/drain regions.

While the present application has been described with reference to a number of specific embodiments, it will be understood that the true spirit and scope of the application should be determined only with respect to claims that can be supported by the present specification. Further, while in numerous cases herein wherein systems and apparatuses and methods are described as having a certain number of elements it will be understood that such systems, apparatuses and methods can be practiced with fewer than the mentioned certain number of elements. Also, while a number of particular embodiments have been set forth, it will be understood that features and aspects that have been described with reference to each particular embodiment can be used with each remaining particularly set forth embodiment. For example, features or aspects described using FIG. 1a can be applied to embodiments described using FIG. 6.

We claim:

1. A semiconductor device comprising:
    a semiconductor substrate; and
    a nonvolatile memory cell provided on the semiconductor substrate, the nonvolatile memory cell comprising:
        a tunnel insulating film provided over a surface of the semiconductor substrate, the tunnel insulating film comprising a layer of monodispersed molecules;
        a charge storage layer provided on the tunnel insulating film;
        an insulating film provided on the charge storage layer; and
        a conductive layer provided on the insulating film.

2. The semiconductor device of claim 1, wherein said monodispersed molecules include fullerene molecules.

3. The semiconductor device of claim 2, wherein the fullerene molecules comprise $C_{60}$ molecules.

4. The semiconductor device of claim 3, wherein $C_{60}$ molecules include variable prescribed energy level characteristics by chemical functionalization.

5. The semiconductor device of claim 1, wherein said monodispersed molecules are conductive, and wherein the monodispersed molecules comprise $C_{60}$ molecules and a metal molecule, wherein the metal molecule comprises chromium or titanium.

6. The semiconductor device of claim 1, wherein the layer of monodispersed molecules are between first and second tunnel insulating layers.

7. The semiconductor device according to claim 6, wherein the first and second tunnel insulating layers or the insulating film comprise a silicon oxide film or a dielectric insulating film.

8. The semiconductor device of claim 1, wherein the layer of monodispersed molecules is about 0.5 nm thick, less than 1 nm thick, less than 1.2 nm thick, less than 2 nm thick, or less than 3 nm thick, and wherein the first and second tunnel insulating layers are less than 8 nm thick, less than 5 nm thick, less than 3 nm thick, less than 2 nm thick, or less than 1 nm thick.

9. The semiconductor device of claim 1 comprising:
    a first electrode coupled to a first impurity region in the semiconductor substrate;
    a second impurity region in the semiconductor substrate; and
    an electrode coupled to a channel region in the semiconductor substrate between the first impurity region and the second impurity region, wherein the tunnel insulating film is over a portion of the channel region.

10. The semiconductor device according to claim 9, wherein the conductive layer is a control electrode, the first electrode is a source electrode and the second electrode is a drain electrode, wherein the first and second impurity regions comprise an n-type impurity or a p-type impurity.

11. The semiconductor device according to claim 1, wherein the nonvolatile memory cell stores more than one bit of data.

12. The semiconductor device according to claim 1, wherein the semiconductor device comprises an array of memory cells, wherein the nonvolatile memory cell is a NAND type nonvolatile memory cell, or a NOR type nonvolatile memory cell.

13. The semiconductor device of claim 1, wherein the semiconductor device comprises a flash memory card, an EEPROM device, or a nonvolatile memory device.

14. A nonvolatile flash memory card, comprising:
    a random access memory array;
    an input/output unit to operatively connect the random access memory to receive or transmit data; and
    a microcontroller to control data storage or data retrieval between the input/output unit and the random access memory array, wherein at least one cell of the random access memory array comprises,
        a semiconductor region having a source region, a drain region, and a channel region provided between the source region and the drain region,
        a first tunnel insulation film formed on the channel region,
        a barrier layer formed on the first tunnel insulation film, the barrier layer comprising a layer of monodispersed molecules, the barrier layer including a prescribed energy barrier level,
        a second tunnel insulation film formed on the barrier layer,
        a charge storage portion formed over the second tunnel insulation film, and
        a control electrode on the charge storage portion.

15. The nonvolatile flash memory card of claim 14, wherein said barrier layer is monodispersed molecules are-fullerene molecules.

16. The nonvolatile flash memory card of claim 15, wherein the fullerene molecules comprise $C_{60}$ molecules.

17. The nonvolatile flash memory card of claim 14, wherein said monodispersed molecules are conductive.

* * * * *

UNITED STATES PATENT AND TRADEMARK OFFICE
CERTIFICATE OF CORRECTION

PATENT NO. : 8,542,540 B2  Page 1 of 1
APPLICATION NO. : 12/748253
DATED : September 24, 2013
INVENTOR(S) : Kan et al.

It is certified that error appears in the above-identified patent and that said Letters Patent is hereby corrected as shown below:

Title Page, Item (75) Inventors, should read

--(75) Inventors: Edwin C. Kan, Ithaca, NY (US);
Tuo-Hung Hou, Chia-Yi (TW);
Ramesh Sivarajan, Shrewsbury, MA (US)--.

Signed and Sealed this
Twenty-fourth Day of November, 2015

Michelle K. Lee
*Director of the United States Patent and Trademark Office*

UNITED STATES PATENT AND TRADEMARK OFFICE
CERTIFICATE OF CORRECTION

| | |
|---|---|
| PATENT NO. | : 8,542,540 B2 |
| APPLICATION NO. | : 12/748253 |
| DATED | : September 24, 2013 |
| INVENTOR(S) | : Edwin C. Kan et al. |

It is certified that error appears in the above-identified patent and that said Letters Patent is hereby corrected as shown below:

TITLE PAGE:

Item
--(75) Inventors:   Edwin C. Kan, Ithaca, NY (US);
            Tuo-Hung Hou, Chia-Yi (TW);
            Ramesh Sivarajan, Shrewsbury,
            MA (US)--.
(as corrected to read in the Certificate of Correction issued November 24, 2015) is deleted and patent is returned to its original state with the Inventors name in patent to read
    --Edwin C. Kan, Ithaca, NY (US);
      Tuo-Hung Hou, Chia-Yi (TW)--.

Signed and Sealed this
Eighth Day of March, 2016

Michelle K. Lee
*Director of the United States Patent and Trademark Office*

UNITED STATES PATENT AND TRADEMARK OFFICE
CERTIFICATE OF CORRECTION

| | | |
|---|---|---|
| PATENT NO. | : 8,542,540 B2 | Page 1 of 1 |
| APPLICATION NO. | : 12/748253 | |
| DATED | : September 24, 2013 | |
| INVENTOR(S) | : Kan et al. | |

It is certified that error appears in the above-identified patent and that said Letters Patent is hereby corrected as shown below:

Title Page, Item (75) Inventors, should read

--(75) Inventors:  Edwin C. Kan, Ithaca, NY (US);
Tuo-Hung Hou, Chia-Yi (TW);
Ramesh Sivarajan, Shrewsbury, MA (US)--.

Signed and Sealed this
Fifth Day of April, 2016

Michelle K. Lee
*Director of the United States Patent and Trademark Office*